(12) United States Patent
Beck

(10) Patent No.: US 8,471,574 B2
(45) Date of Patent: Jun. 25, 2013

(54) METHOD AND DEVICE FOR DETECTING UNDERPERFORMING PV MODULES IN A PV SYSTEM BY USING DISCONNECT SWITCHES

(75) Inventor: Bernhard Beck, Volkach OT Dimbach (DE)

(73) Assignee: Adensis GmbH, Dresden (DE)

( * ) Notice: Subject to any disclaimer, the term of this patent is extended or adjusted under 35 U.S.C. 154(b) by 268 days.

(21) Appl. No.: 13/034,085

(22) Filed: Feb. 24, 2011

(65) Prior Publication Data

US 2011/0204900 A1    Aug. 25, 2011

(30) Foreign Application Priority Data

Feb. 24, 2010   (DE) .......................... 10 2010 009 079

(51) Int. Cl.
     *G01R 27/08*      (2006.01)
     *G01R 31/08*      (2006.01)
     *G01R 31/02*      (2006.01)

(52) U.S. Cl.
     USPC ........................... 324/713; 324/522; 324/537

(58) Field of Classification Search
     USPC .............. 324/537, 500, 713, 76.39, 111, 348, 324/363, 522
     See application file for complete search history.

(56) References Cited

U.S. PATENT DOCUMENTS

| | | | | |
|---|---|---|---|---|
| 7,812,592 B2 * | 10/2010 | Prior et al. | ................. | 324/76.39 |
| 2009/0182532 A1 | 7/2009 | Stoeber et al. | | |
| 2010/0301670 A1 * | 12/2010 | Wilhelm | ......................... | 307/23 |
| 2011/0121652 A1 * | 5/2011 | Sella et al. | ...................... | 307/43 |

FOREIGN PATENT DOCUMENTS

| | | |
|---|---|---|
| DE | 10 2007 044 166 A1 | 4/2008 |
| DE | 10 2008 003 272 A1 | 7/2009 |
| EP | 2 136 411 A1 | 12/2009 |

\* cited by examiner

*Primary Examiner* — Hoai-An D Nguyen
(74) *Attorney, Agent, or Firm* — Muncy, Geissler, Olds & Lowe, PLLC

(57) ABSTRACT

A measuring method for determining an output drop of a PV unit is provided. The PV unit is arranged within a photovoltaic system comprising a plurality of electrically parallel-connected PV units. Each PV unit can be removed from the parallel circuit by a switching device. Further, a total current measuring device for measuring the total current through all PV units of the parallel circuit is provided. The defective PV unit is determined in an evaluation unit by the connection and disconnection of a disconnect switch.

9 Claims, 4 Drawing Sheets

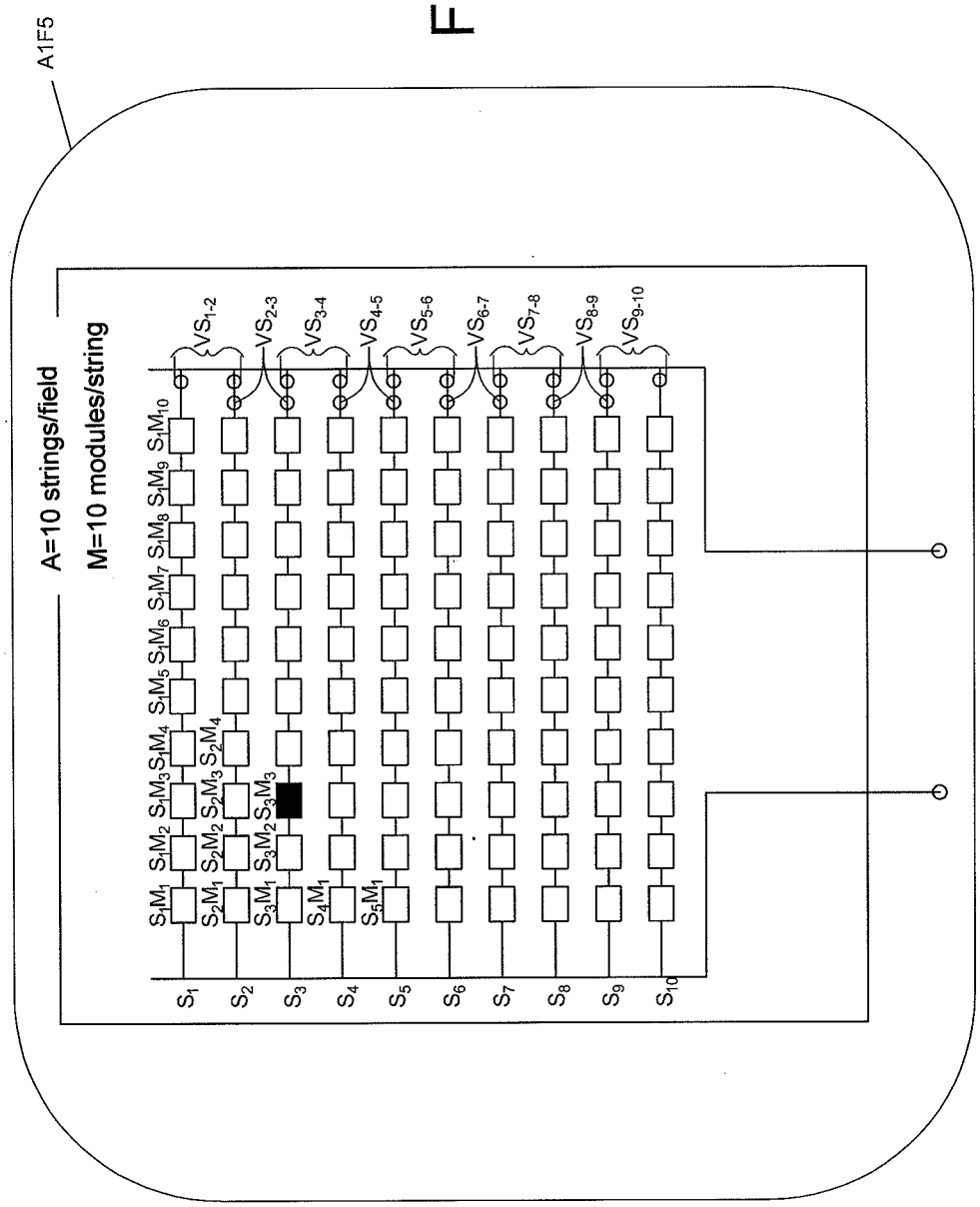

METHOD AND DEVICE FOR DETECTING UNDERPERFORMING PV MODULES IN A PV SYSTEM BY USING DISCONNECT SWITCHES

This nonprovisional application claims priority under 35 U.S.C. §119(a) to German Patent Application No. DE 10 2010 009 079.4, which was filed in Germany on Feb. 24, 2010, and which is herein incorporated by reference.

BACKGROUND OF THE INVENTION

1. Field of the Invention

The present invention relates to a method for detecting a string with an underperforming PV module within a larger PV system with a plurality of electrically parallel-connected PV units (S, F), and with a total current measuring device for measuring the total current through all PV units of the parallel circuit and to an associated device for carrying out the method.

2. Description of the Background Art

Large PV systems may comprise thousands of PV modules, which must be measured individually, to identify and localize a faulty module. This effort is necessary, because the presence of a single module or also a plurality of underperforming, if not even defective, modules is no longer noticed in the total output. A defective module, in which a photovoltaic cell is nonconducting or in which the soldered connection between two cells is broken, leads to failure of the entire string of, e.g., 10 PV modules connected in series, because a single interruption also interrupts the series connection. At a total output of 2 MW of the photovoltaic system, the contribution of a string of, e.g., 2 KW corresponds to a thousandth part of the output. Even a plurality of defective or underperforming strings over time are not noticed immediately, because the deviation in the generated output can also be caused by weather and the measuring accuracy of the employed transformer when measuring currents in the lower range of the measuring range, inherent to the measuring device, is not sufficiently accurate to detect such small deviations even in unchanging weather. The deviations in the typically employed current measuring transformers, based on magnetic fields, are due to design. Permanently installed systems for power measurement are associated with an unjustifiable expense.

Apart from the above problem of the undetected low performance of the PV system, it is important, particularly during the warranty period, that justified claim options are recognized to make the manufacturer responsible for the defective PV module.

Various options for testing the performance of PV modules are known from the conventional art. In all methods that produce a meaningful result, the PV system must be decoupled from an inverter and connected to a measuring device.

Used as a measuring device in this case are multimeters, which measure the short-circuit current and the open circuit voltage of a PV module, a string with a plurality of PV modules connected serially behind one another, or a PV unit. The purpose of this measurement is to detect the basic function of the PV module, string, or the PV unit.

If the performance of a PV module, string, or a PV unit is to be determined, this occurs preferably by the connection of a U-I characteristic measuring device, which can measure the corresponding U-I characteristic. The thus measured characteristic is supplemented by the measured value of an irradiance sensor or a reference solar cell and the measured value of a temperature sensor, which measures the temperature of the PV module. The STC output value (standardized output value for photovoltaic modules) is calculated from the values mentioned above for irradiance, temperature, voltage, and current. This has a high inaccuracy, however, because of the many tolerances in the sensors used for the calculation.

Further, measurement with a current probe, with which the current strength of a PV module, string, or a PV unit can be determined during operation, is known from the state of the art. However, because voltage, irradiance, and temperature are not known, this type of measurement is sufficient only for the mere testing of functionality and the testing of fuses. All of the methods and devices in the prior art are not a sufficiently satisfactory solution in regard to their accuracy, the time needed for the measurement, and their applicability during operation.

SUMMARY OF THE INVENTION

It is therefore an object of the present invention to identify a defective or underperforming string, in which a defective or underperforming PV module is present, with little technical and time expenditure and the lowest possible disruption of the operation.

The object is achieved with the following steps in regard to an embodiment of the method: i) the summed direct current of all parallel-connected PV units is determined with the total current measuring device and its value is stored; ii) one of the PV units is removed from the parallel circuit by means of a switching device assigned to it; iii) the summed direct current through all PV units, with the exception of the removed PV unit, is determined with the total current measuring device and its value is stored; iv) the switch of the removed PV unit is closed, so that the PV unit is once again integrated into the parallel circuit; v) steps ii) to iv) are performed for all PV units in the parallel circuit; and vii) the stored current values are provided to an evaluation unit.

In the first process step, the total current of the PV system connected to an inverter is measured. This is, for example, 50 A in a PV system with 5 fields of 10 strings each with 10 PV modules in each case. Each field therefore produces 10 A on average. If the first field is removed from the parallel circuit, for example, a current value for the remaining four fields of 40 A is obtained. This means that the isolated field has contributed precisely the average value (10 A) to the total current of 50 A. Next, the switch assigned to the first field is again closed and the switch of another of the five fields is opened, so that then this field does not make a contribution to the total current. A repeated measurement of the total current through the remaining four fields produces, for example, a value of 40.7 A. As a result, the second removed field only provides a current contribution of 9.3 A. The switch assigned to this field is again closed, and the switch of a third field is opened. In the numerical example, current values are obtained for the remaining three fields at a total current of 39.7 A, 39.7 A, and 39.9 A, which corresponds to a specific field current of 10.3 A, 10.3 A, or 10.1 A, respectively. The total sum for all five fields of 50 A therefore includes the sum of the individual field currents of 10 A, 9.3 A, 10.3 A, 10.3 A, and 10.1 A. A conclusion can be reached directly from this result that the field measured at the second position has a defect and should be tested further. If a switch were to be provided in each string of the individual fields, the low-performing string (strings) can be determined in a similar way.

It is advantageous in the measuring process if the first step is also included each time in the fifth step. Measurements are taken in fact under unchangeable weather conditions, but then minor deviations in the total current due to a change in irradiance, a change in the temperature of the semiconductor, etc., can also be eliminated. This applies especially when the individual total currents measured with the elimination of one field are related to the previously measured total current of all fields.

To make the individual measurements of all fields highly comparable, it is advised that the PV units be set to the same operating voltage value during process steps i) through v). In the numerical example, the individual contribution of the fields would then be respectively 20% (10/50), 18.6% (9.3/50), 20.6% (10.3/50), 20.6% (10.3/50), and 20.2% (10.1/50). Depending on the tolerance range guaranteed by the manufacturer of the PV modules and the tolerance deviation assumed by the installer of the PV system on-site, in the previously described example possibly also the first field should be examined more closely, because with 10 A it in fact achieves the average, but nevertheless is lower in its performance in comparison with the three other fields.

To make the individual measurements of all fields highly comparable, without correction factors being necessary for the changed voltages, it is advisable for the PV units to be set to the same operating voltage value during process steps i) through v).

A particular advantage is to develop the measuring method further so that the evaluation unit compares the measured current values, stored at a time $t_0$, with the corresponding measured current values determined at a later time $t_1$. This additional feature makes possible not only the testing of the PV system for module or assembly errors after the installation, but the functionality of the PV fields or the PV strings can be checked in a simple way at any time. Thus, e.g., shortly before the expiration of the warranty period for the PV modules, a measuring scan of the type given as an example can be performed, in which it is noted immediately when a module has a break between two cells. It can be determined at a later time which fields have a normal degradation behavior or which fields, strings, or modules have aged more rapidly than promised.

To achieve a high reliability of the stored current values, relations, or other connections, it is expedient to make the current measurement several times in rapid succession (e.g., several milliseconds), e.g., 5 to 10 times, and to form the arithmetic mean for the current measurements made in rapid succession.

If a string is regarded as the PV unit to be tested for faults, each field is to be assigned its own stationary current sensor, which then becomes the total current measuring device within the meaning of present claims. If it is a field that is to be tested for a fault, then the total current measuring device is to be provided in the supply lead to the inverter.

In regard to the device, the object set forth above is achieved by a photovoltaic system comprising a plurality of electrically parallel-connected PV units (S, F), whereby each PV unit can be removed from the parallel circuit by means of a switching device ($T_1$ to $T_{10}$), and a total current measuring device, which measures the direct current through the parallel circuit. The embodiments and advantages of the method arise in a similar way.

To evaluate the extent to which an individual PV unit may deviate from its expected output, it is provided that a single PV unit is established by means of current measurement, voltage measurement, irradiance intensity, and direct or indirect temperature measurement at the semiconductor as a reference PV unit, according to standardized test conditions (STC), established for photovoltaic modules to determine the standard output. Then, by a comparison of the actually determined output of any PV unit with the standard performance (according to STC), a first evaluation can occur on the extent to which there is an acceptable deviation or a deviation to be pursued further.

In particular, in similarly constructed PV units, this type of evaluation of individual performance of a PV unit can also occur by comparison with a reference PV unit, which was previously defined as such. This is advantageously the PV unit that had generated the highest output in the first output determination on an ideal day relative to weather, or, e.g., on the occasion of the startup of the photovoltaic system. This output is then used as the best possible reference for the used type in the PV unit. If the output of any other PV unit deviates downward from the limit of, e.g., 97% of the reference unit output, a faulty assembly or a defective component is concluded.

The introduced method is not intended for daily use, but rather to check the performance of the PV system at regular intervals of, e.g., a few months. It is justifiable in this respect that all PV units, which are connected to the same inverter, can be kept at a constant voltage during all direct current measurements, in that the MPP (maximum power point) controller of the inverter is fixed at the constant voltage value. The loss occurring for the duration of the measurement due to a mismatch to the maximum output point of the inverter is acceptable. A major advantage of the method here is that with the actuation of a single switch immediate information on the output status of the affected PV unit can be obtained.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1a shows an array according to an embodiment;

DETAILED DESCRIPTION

Figure 1:
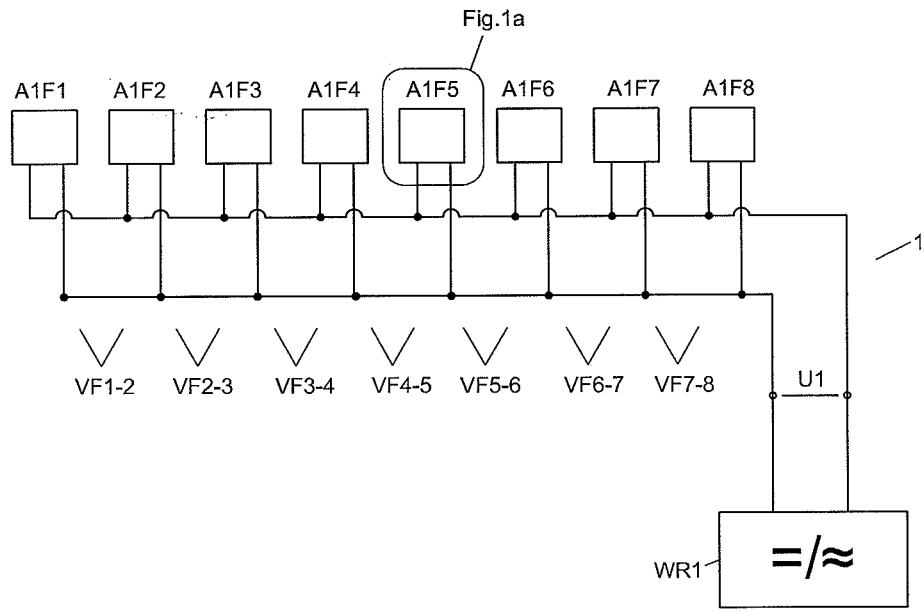
FIG. 1 shows a basic structure of a larger photovoltaic system.
Figure 1:
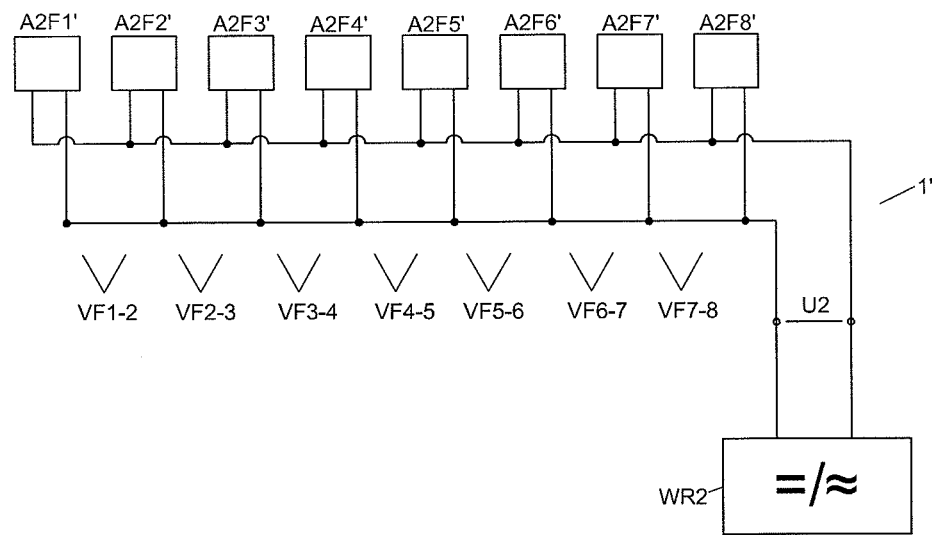

A first and second photovoltaic system, made structurally the same, is designated with 1 and with 1' in FIG. 1 with the detail view of FIG. 1a. This means that each PV system 1, 1' has eight fields $F_1$ to $F_8$ or $F_{1'}$ to $F_{8'}$, in the designation of which the prefix $A_1$ is used for system 1 or $A_2$ for system 2. Only the first system $A_1$ will be elaborated in detail.

The first system $A_1$ has eight fields $A_1F_1, A_1F_2, \ldots$ to $A_1F_8$ which in turn are all constructed similarly. As is evident in the example of field $A_1F_5$ (system 1, fifth field) in the detail figure FIG. 1a, each system field AF has 10 electrically parallel-connected strings S, which are numbered consecutively using $S_1$ to $S_{10}$. Each string $S_1$ to $S_{10}$ in turn has a series connection of 10 PV modules M, which for their part are numbered consecutively with $M_1$ to $M_{10}$. One of the 100 PV modules $S_1M_1$ to $S_{10}M_{10}$ of the third field $F_3$ is shown as completely black, namely the photovoltaic module $S_3M_3$ in field $F_3$ which is assumed to have been fault-free during the installation of the system and to have become defective over time. Each module M has about 60 PV cells, which are connected in series. The PV cell is the smallest unit in which sunrays are converted into current. The 60 cells are connected in series to one another, so that at an operating voltage of 1 V per cell a voltage of 60 V is built up across the module. In the case of 10 modules connected in series, the voltage across the entire string, also called string voltage, is then 600 V. If one of the 10 times 60=600 cells of a string S becomes nonconductive, or one of the connections between the cells is broken, as a result of the series connection the entire string S drops out of the current supply. Such a case is assumed by way of example in module $S_3M_3$ and it will be explained hereafter how string S and later also module M can be identified.

The reason for the underlying problem is important, because depending on the size of the PV system, as addressed in the introductory section, it is not noted further when an individual string fails, because its contribution to the total output is relatively low. On the other hand, it behaves like a dripping faucet, which loses only small amounts of water, but these small amounts add up to a significant loss over time, in the PV plant construction over several decades. Thus, it is necessary for economic and warranty-based reasons to be able to evaluate the output status not only of the entire system but also of the individual PV units of the system.

Figure 2:
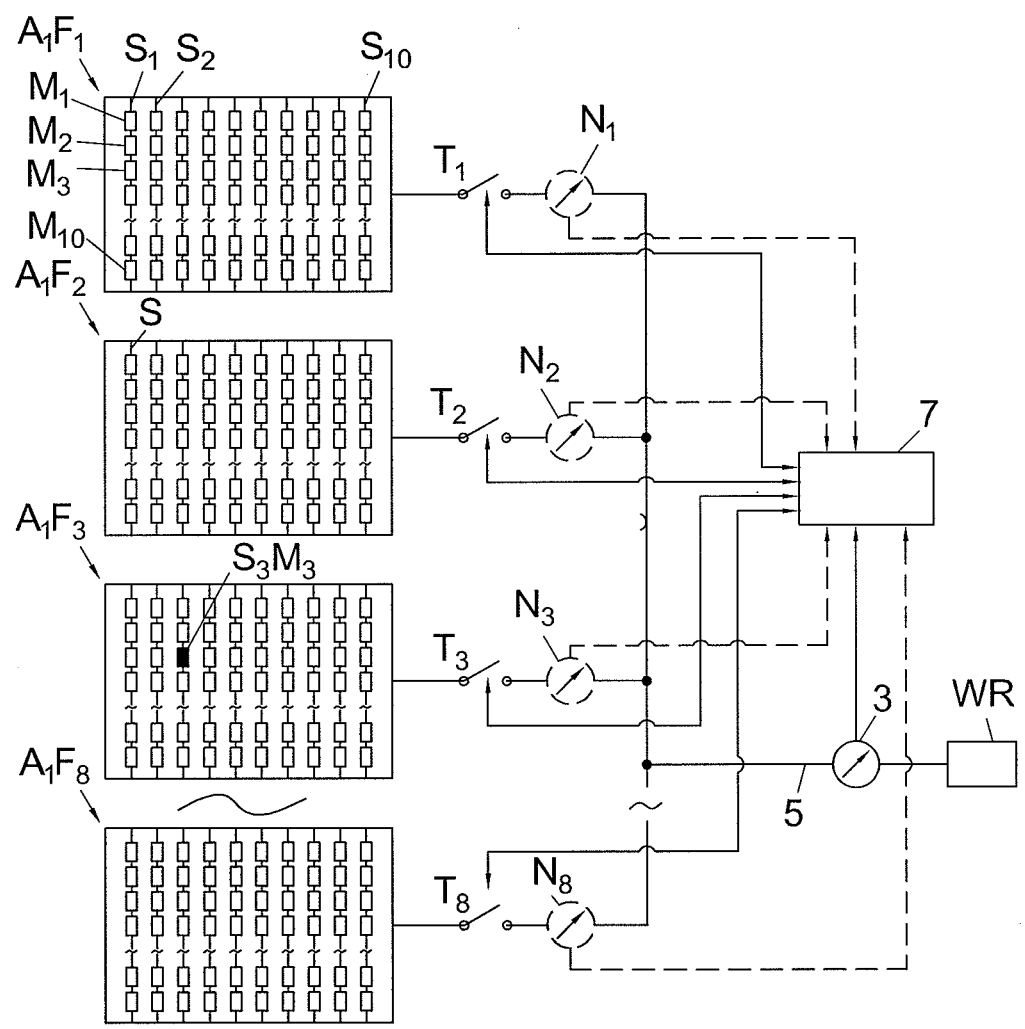
FIG. 2 shows a measuring and evaluation unit for use in a system according to FIG. 1.

In FIG. 2, a field F is regarded as a PV unit, in which a reduced output is to be analyzed. A disconnect switch $T_1$ to $T_8$, which makes it possible to remove the assigned field $F_1$ to $F_8$ from the parallel circuit and to connect it again to the parallel circuit, is integrated into each of the eight parallel-connected fields $F_1$ to $F_8$ of PV system 1. A current sensor $N_1$ to $N_8$, which measures the direct current I flowing through the connecting lead of field F, is provided in series to each disconnect switch $T_1$ to $T_8$. The importance of the current sensors $N_1$ to $N_8$ will be discussed in greater detail later.

A total current measuring device 3 measures the direct current I flowing through the entire path of the parallel circuit and is provided in the course of a feed or current supply line 5. The determined current values are supplied to a measured value acquisition and evaluation unit 7, which compares and optionally evaluates the specifically measured current values of reference current measuring device 3.

It can be assumed in the example of the PV system according to FIG. 1 that each field F supplies a total current between 10 and 50 A, depending on the type of employed PV module. For the sake of simplicity, a total current of 10 A is assumed. A fictitious test result after steps i) to v) are performed could produce the following test results for the individual field currents $I_F$ in the assumed fault in photovoltaic module $S_3M_3$ in field $F_3$, whereby a total current I of 79 A in all closed eight switches $T_1$ to $T_8$ can be assumed:

$I_{F1}$=10.1 A determined from the difference $IT_{1\ open}$ and $IT_{1\ closed}$
$I_{F2}$=10.1 A determined from the difference $IT_{2\ open}$ and $IT_{2\ closed}$
$I_{F3}$=9.0 A determined from the difference $IT_{3\ open}$ and $IT_{3\ closed}$
$I_{F4}$=9.9 A determined from the difference $IT_{4\ open}$ and $IT_{4\ closed}$
$I_{F5}$=9.8 A determined from the difference $IT_{5\ open}$ and $IT_{5\ closed}$
$I_{F6}$=10.0 A determined from the difference $IT_{6\ open}$ and $IT_{6\ closed}$
$I_{F7}$=10.0 A determined from the difference $IT_{7\ open}$ and $IT_{7\ closed}$
$I_{F8}$=10.1 A determined from the difference $IT_{8\ open}$ and $IT_{8\ closed}$ In the fault-free case of the theoretically expected total current I for all eight fields F taken together would, for example, be 80 A. However, only 79 A were measured in the first measurement in step i). Then switches T of the eight fields F are closed sequentially and opened again, whereby the above pattern results: Field $F_3$ is reduced by 10% in its output, which suggests a fault in this field. If another disconnect switch T' (not shown) is now provided in each string, by means of which each individual string $S_1$ to $S_{10}$ can be removed or switched off from the parallel circuit of 10 strings S, the following situation would result by way of example:

$I_{S1}$=1.1 A determined from the difference $IT_{1\ open}$ and $IT_{1\ closed}$
$I_{S2}$=1.1 A determined from the difference $IT_{2\ open}$ and $IT_{2\ closed}$
$I_{S3}$=0.0 A determined from the difference $IT_{3\ open}$ and $IT_{3\ closed}$
$I_{S4}$=0.99 A determined from the difference $IT_{4\ open}$ and $IT_{4\ closed}$
$I_{S5}$=0.98 A determined from the difference $IT_{5\ open}$ and $IT_{5\ closed}$
$I_{S6}$=1.0 A determined from the difference $IT_{6\ open}$ and $IT_{6\ closed}$
$I_{S7}$=1.0 A determined from the difference $IT_{7\ open}$ and $IT_{7\ closed}$
$I_{S8}$=1.1 A determined from the difference $IT_{8\ open}$ and $IT_{8\ closed}$
$I_{S9}$=1.0 A determined from the difference $IT_{9\ open}$ and $IT_{9\ closed}$
$I_{S10}$=1.0 A determined from the difference $IT_{10\ open}$ and $IT_{10\ closed}$ The total current I=9 A includes the sum of only 9 instead of the 10 string currents I, to be expected with 10 strings, because the defective module $S_3M_3$ has become nonconductive and therefore the entire third string does not generate any current. A localization of the fault solely by the data evaluation of evaluation unit 7 is possible in this way. The detection of the ultimately faulty module $S_3M_3$ occurs by means of separation of plug connections, which connect the PV modules to one another, and the measurement of the specific resistance across the modules M.

The measurement for checking for defects can occur routinely each day, because it requires only a few seconds. Thus, an early occurrence of defects in modules M is determined.

Figure 3:
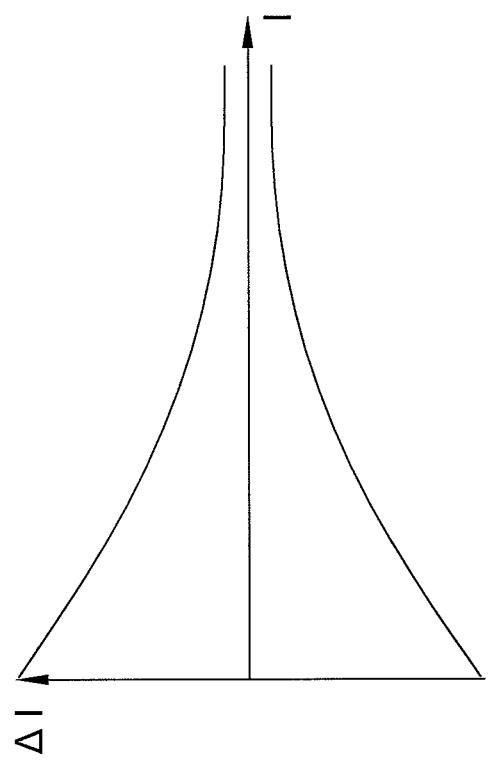
FIG. 3 shows an explanatory illustration of a measuring transformer response with its ΔI to I deviation.

A typical characteristic $\Delta I$ to I, which shows the deviation of the measuring inaccuracy $\Delta I$ across direct current I, is illustrated in FIG. 3. The measuring principle of the employed converter is based on a measurement of the magnetic field built up by the current. In the case of small currents I, the measuring tolerance $\Delta I$ of the transformer is relatively high in comparison with the deviation $\Delta I$, present at high currents I, because weak magnetic fields are more difficult to measure exactly than strong fields. The present invention is based on this realization in that measurements are made only in the end range of the total current measuring device, in which a reliable measurement with limited variation is possible. Therefore, this is a departure from the classic approach of integrating a separate current measuring device into each current path of a PV unit. The disadvantage that a disconnect switch must be present in each current path is more than compensated by the saving of the precise transformer per path (or replacement by an inexpensive device) and the gain in the meaningfulness of the measurement. The not absolutely necessary transformer per path is nonetheless shown as an option with a broken line in the figures, if necessary to handle other functions.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A measuring method for determining a drop in an output of a PV (PhotoVoltaic) unit within a photovoltaic system comprising a plurality of electrically parallel-connected PV units, whereby each PV unit is removable from the parallel circuit via a switching device and a total current measuring device for measuring the total current through all PV units of the parallel circuit, the method comprising:
   i) determining a summed direct current of all parallel connected PV units with a total current measuring device and storing a value thereof;
   ii) removing one of the PV units from the parallel circuit via the switching device assigned to it;
   iii) determining the summed direct current through all PV units, with the exception of the removed PV unit, with the total current measuring device and storing a value thereof;
   iv) closing a switch of the removed PV unit such that the PV unit is once again integrated into the parallel circuit;
   v) performing steps ii) to iv) for all PV units in the parallel circuit; and
   vii) providing the stored current values to an evaluation unit.

2. The measuring method according to claim 1, wherein in step v) the steps i) through iv) are repeated successively for each of the PV units.

3. The measuring method according to claim 1, wherein the PV units are set to the same operating voltage value during process steps i) through v).

4. The measuring method according to claim 1, wherein the evaluation unit compares the measured current values, stored at a time $t_0$, with the corresponding measured current values determined at a later time $t_1$.

5. The measuring method according to claim 1, wherein in the evaluation circuit the measured current value measured in step i) is related to the measured current value measured in step iii).

6. The measuring method according to claim 1, wherein the PV systems has at least five parallel connected PV units.

7. The measuring method according to claim 1, wherein the stored measured current values are formed from an arithmetic mean of a plurality of current measurements made in rapid succession.

8. The measuring method according to claim 1, wherein each PV unit is assigned its own stationary current sensor.

9. A device for carrying out the method according to claim 1, comprising a photovoltaic system having a plurality of electrically parallel-connected PV units, wherein each PV unit is removable via a switching device from the parallel circuit, and by a total current measuring device, which measures the direct current through the parallel circuit.

* * * * *